United States Patent [19]

Sakuyama

[11] Patent Number: 5,479,424
[45] Date of Patent: Dec. 26, 1995

[54] OPTICAL MODULATING AND AMPLIFYING APPARATUS CAPABLE OF ACHIEVING MODULATION WITH HIGH SIGNAL-TO-NOISE RATIO

[75] Inventor: Hiroshi Sakuyama, Tokyo, Japan

[73] Assignee: NEC Corporation, Tokyo, Japan

[21] Appl. No.: 260,745

[22] Filed: Jun. 15, 1994

[30] Foreign Application Priority Data

Jun. 15, 1993 [JP] Japan ..................... 5-167336

[51] Int. Cl.⁶ ..................................... H01S 3/13
[52] U.S. Cl. ............... 372/26; 372/38; 359/345; 359/341
[58] Field of Search ..................... 372/26, 6, 38, 372/31; 359/341, 345

[56] References Cited

U.S. PATENT DOCUMENTS

| 4,789,987 | 12/1988 | Fraser | 372/31 |
| 4,924,470 | 5/1990 | Ries | 372/31 |
| 5,127,015 | 6/1992 | Chikugawa et al. | 372/38 |

FOREIGN PATENT DOCUMENTS

| 0415438 | 3/1991 | European Pat. Off. . | |
| 0504777 | 9/1992 | European Pat. Off. . | |
| 257186A | 10/1993 | Japan | 359/341 |
| 2242091 | 9/1991 | United Kingdom . | |

Primary Examiner—Rodney B. Bovernick
Assistant Examiner—Yisun Song
Attorney, Agent, or Firm—Sughrue, Mion, Zinn, Macpeak & Seas

[57] ABSTRACT

An optical modulating and amplifying apparatus includes an optical amplifier and a modulator. In the apparatus, an input optical signal and an excited light are combined with each other to produce an output light signal. The excited light from a laser diode is sensed by a photodiode. The sense signal includes a bias and an amplitude to be respectively detected by a mean value sensor and a modulation signal sensor. A modulation degree of the excited light is computed by a divider. A control signal to develop a predetermined modulation degree is delivered from a control signal generator to a variable gain amplifier. In response to the control signal, the amplifier controls the amplitude of the oscillation signal from an oscillator. A laser diode driver adds a bias to the oscillation signal to drive the laser diode. The modulation degree is kept unchanged regardless of variation in an output level of the excited light so as to achieve the modulation with a high signal-to-noise ratio.

7 Claims, 5 Drawing Sheets

OPTICAL MODULATING AND AMPLIFYING APPARATUS CAPABLE OF ACHIEVING MODULATION WITH HIGH SIGNAL-TO-NOISE RATIO

BACKGROUND OF THE INVENTION

The present invention relates to an optical modulating and amplifying apparatus, such as in a repeater of a submarine optical cable and in particular, to an optical modulating and amplifying apparatus in which a modulation signal is superimposed onto a signal light.

DESCRIPTION OF THE PRIOR ART

Figure 1:
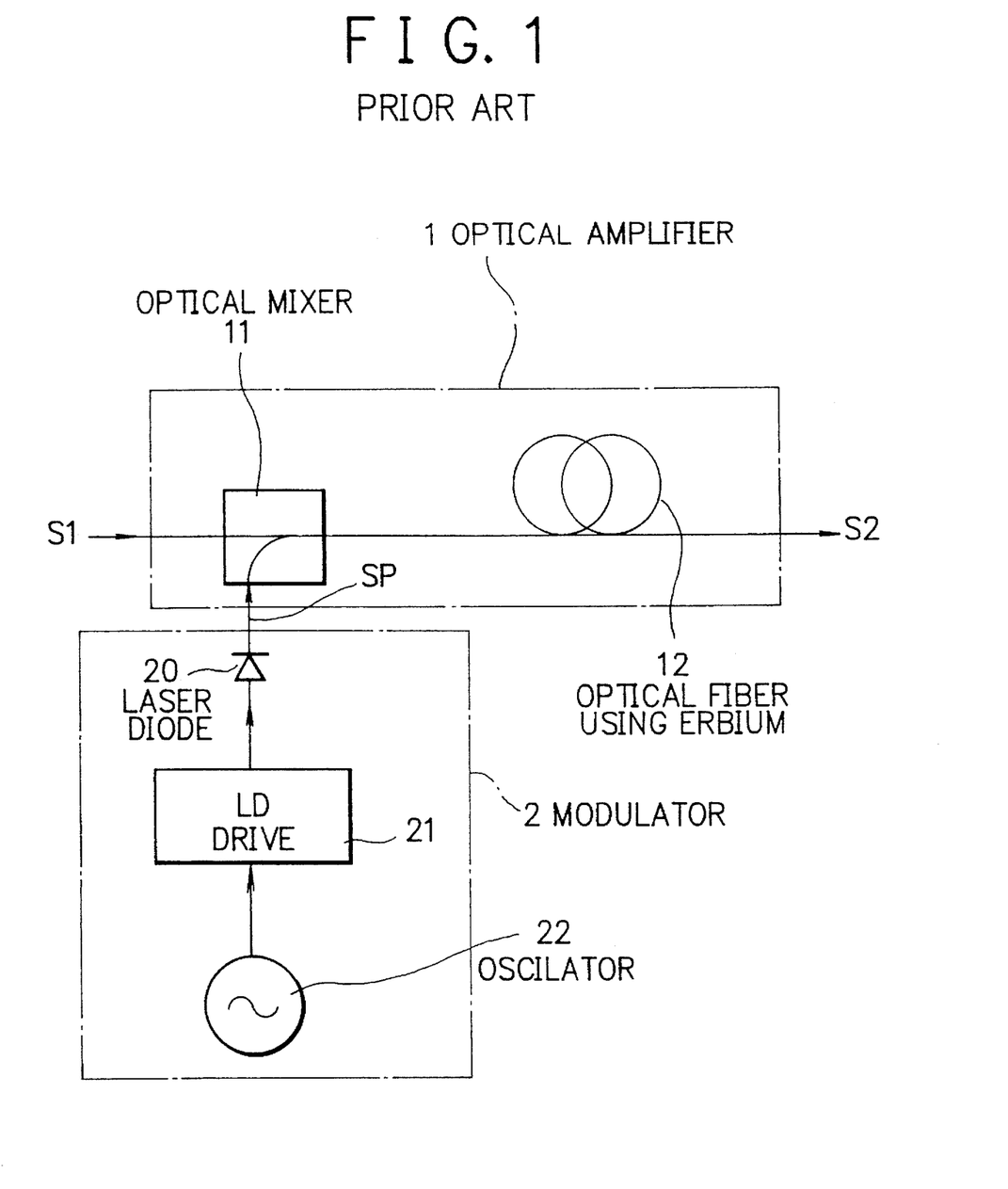
FIG. 1 is a schematic block diagram showing an example of the basic configuration of the conventional optical modulating and amplifying apparatus.

Heretofore, a conventional optical modulating and amplifying apparatus includes, as shown in FIG. 1, an optical amplifier 1 including an optical mixer 11 for mixing an input light signal S1 to undergo modulation with an excited light SP undergone modulation and an optical fiber 12 using erbium. In addition to the optical mixer 11 constituting the optical amplifier 1, there is additionally disposed a modulator 2 for supplying the excited light SP to the mixer 11. The modulator 2 includes a laser diode 20 for producing an excited light, a laser diode driving circuit 21 for supplying a bias signal to the laser diode 20, and an oscillator 22 for producing and delivering a modulation signal to the driver 21.

In the optical amplifier modulator above, the modulation signal from the oscillator 22 and the bias signal from the driver 21 are used to create a driver current. The current drives the laser diode 20 to emit an excited light SP. The modulated light SP is then fed to the mixer 11 to be superimposed onto the input optical signal S1. The resultant signal is propagated through the fiber 12 to be outputted therefrom as an optical signal S2. Namely, the modulated signal SP is used to alter the gain of the optical amplifier 1 for the modulation of the input optical signal S1.

However, in the conventional apparatus, since the modulated output signal delivered from the oscillator 22 has substantially a fixed output level, variation in the output level of excited light SP from the diode 20 causes the modulation degree is to be also changed. In a case where the degree of modulation is increased, the modulation signal becomes a noise of the signal undergone the superimposition and hence the signal-to-noise (S/N) ratio of the signal is deteriorated. That is, the contents of the input light signal S1 is influenced from the excited signal SP. On the other hand, when the modulation degree is decreased, there appears another problem that the signal superimposed onto the input signal S1 cannot be easily sensed.

Figure 2A:
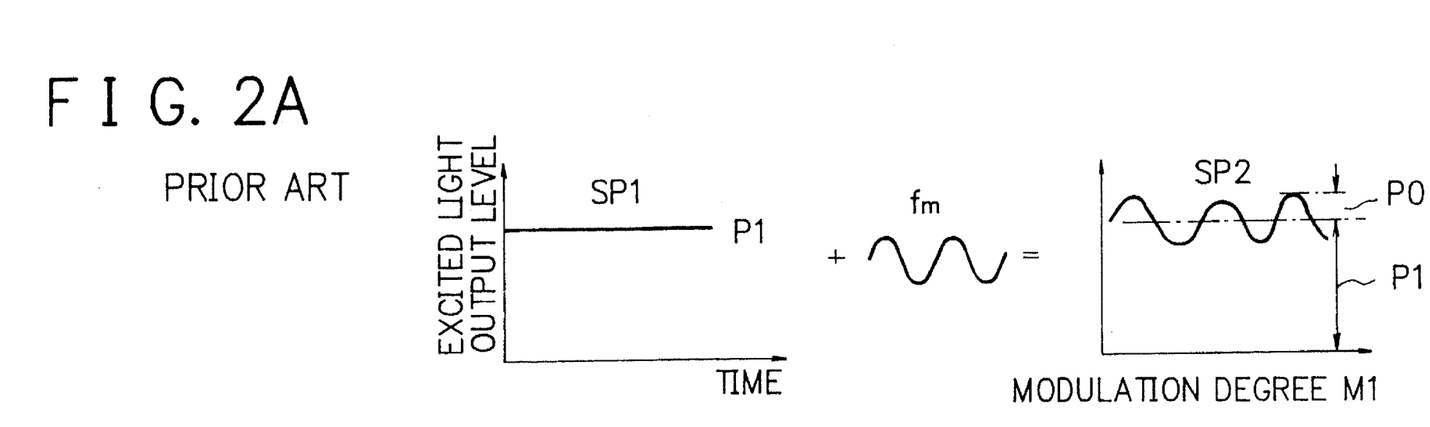
FIG. 2A is a graph showing signal waveforms with the modulation degree set to m1 for explaining a relationship between the amplitude of the modulation signal and the modulation degree in the apparatus of FIG. 1.
Figure 2B:
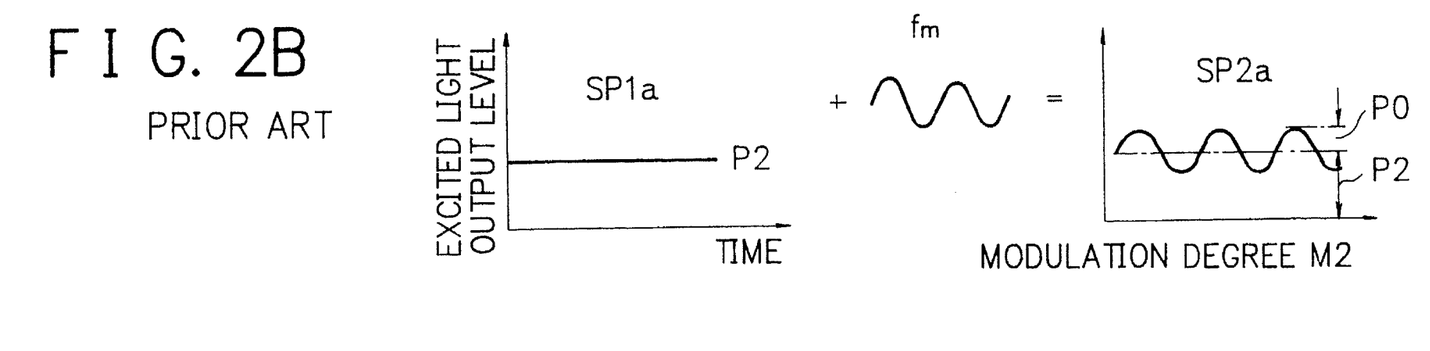
FIG. 2B is a graph showing signal waveforms with the modulation degree set to m2 useful to explain a relationship between the amplitude of the modulation signal and the modulation degree in the apparatus of FIG. 1.

Referring now to drawings, the problem above will be further described. As can be seen from FIG. 2A, the excited light SP1 is a signal having a direct-current (dc) level P1. Using the dc level P1 as a bias, a modulation signal fm (with an amplitude P0) from the oscillator 22 is superimposed onto the excited light SP1 so as to obtain an excited light SP2. Namely, the modulation degree m1 is P0/P1 in this case. However, as shown in FIG. 2B, when the dc level of the excited light SP1a is altered to P2 with the amplitude P0 kept unchanged in the signal fm, the modulation degree m2 of the modulated light SP2a is P0/P2.

As above, the modulated light SP2a has the amplitude P0 which may be larger than the dc level P2. In consequence, the modulation signal fm appears as a noise for the excited light SP1a and adversely influences the gain related to the input signal S1. Namely, the signal-to-noise ratio is deteriorated for the output signal S2.

SUMMARY OF THE INVENTION

It is therefore an object of the present invention to provide an optical modulating and amplifying apparatus capable of achieving a modulation with a high signal-to-noise ratio.

To achieve the object above, there is provided in accordance with the present invention an optical modulating and amplifying apparatus in which according to an oscillation signal produced from an oscillation means, laser light driving means drives laser light emitting means to emit an excited light so that an input signal to the apparatus is optically amplified according to the excited light. The apparatus includes control signal generating means for sensing the excited light and producing a control signal to set a modulation degree of the excited light to a predetermined modulation degree, modulation signal control means for receiving as inputs thereto the control signal and the oscillation signal to produce a modulation signal such that the laser light driving means drives the laser light emitting means according to the modulation signal.

In addition, the apparatus is favorably configured as follows.

The laser light driving means drives the laser light emitting means according to a signal obtained by adding a dc-level bias to the oscillation signal.

The control signal generating means includes mean value sensing means, a modulation signal sensing means, and an operating means. The mean value sensing means senses a dc level of the excited light, the modulation signal sensing means detects an amplitude of a modulation signal superimposed onto the excited light, and the operating means computes the modulation degree according to the dc level and the amplitude of the modulation signal.

The modulation signal control means increases or decreases the amplitude of the oscillation signal according to the control signal produced from the control signal generating means.

The optical modulating and amplifying apparatus further includes laser light sensing means for sensing the exited light emitted from the laser light emitting means.

Consequently, in accordance with the optical modulating and amplifying apparatus of the present invention, the control signal generating means creates a control signal to set the modulation degree of the excited light thus sensed to a predetermined value, the modulation signal control means produces a modulation signal based on the control signal and an oscillation signal, and the laser driver means drives the laser emitting means depending on the modulation signal. Namely, there is formed a loop circuit configuration which controls the operation to drive the laser emitting means emitting the excited light.

BRIEF DESCRIPTION OF THE DRAWINGS

The objects and features of the present invention will become more apparent from the consideration of the following detailed description, taken in conjunction with the accompanying drawings, wherein.

DESCRIPTION OF THE PREFERRED EMBODIMENTS

Figure 3:
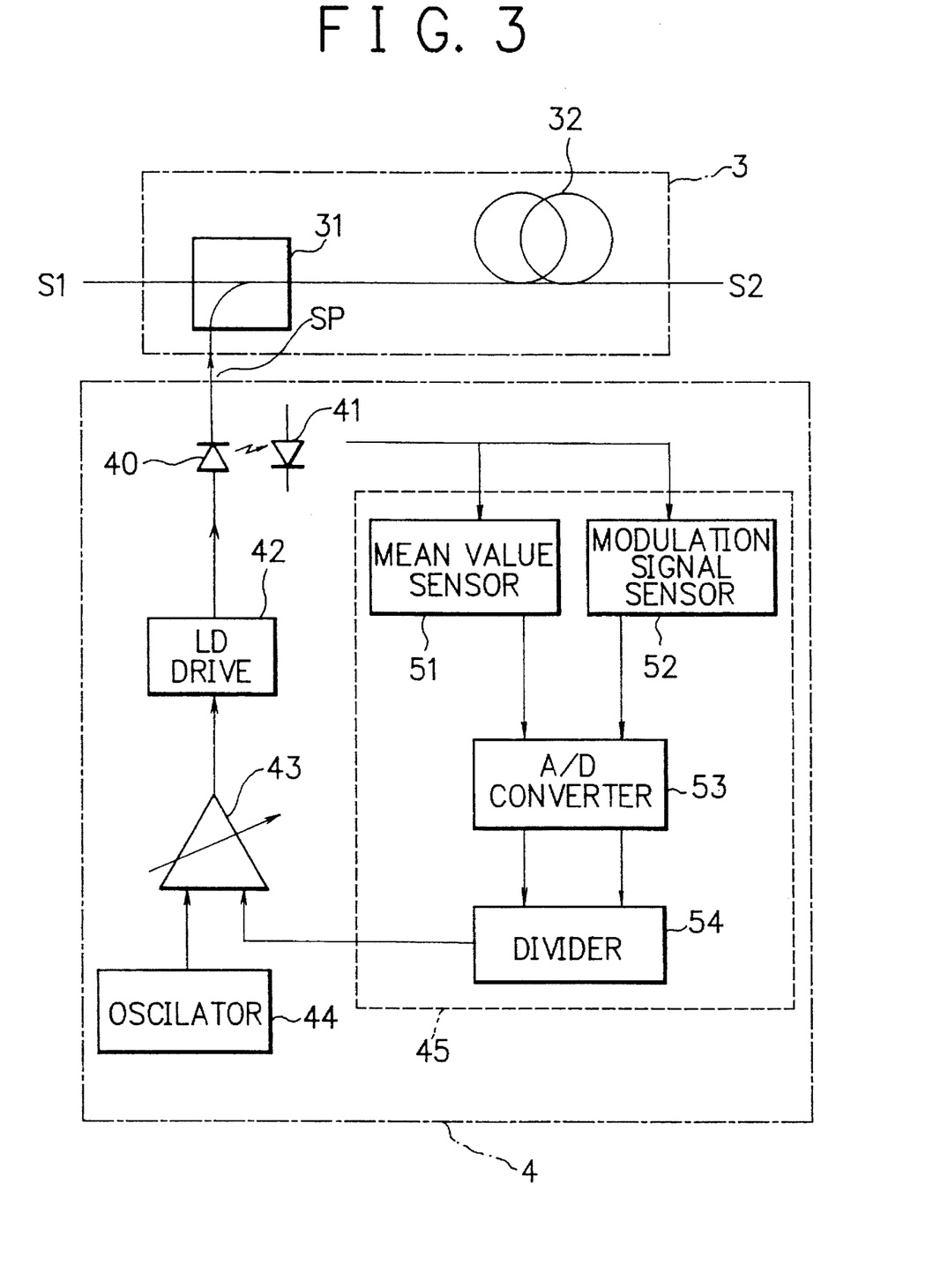
FIG. 3 is a block diagram showing an optical modulating and amplifying apparatus in an embodiment in accordance with the present invention.
Figure 4A:
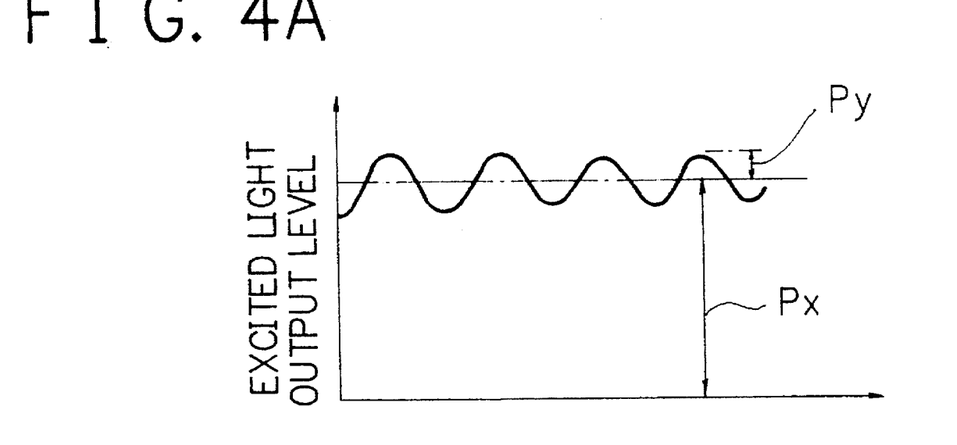
FIGS. 4A to 4C are graphs showing signal waveforms for explaining sensing operations in a control signal generator.
Figure 4B:
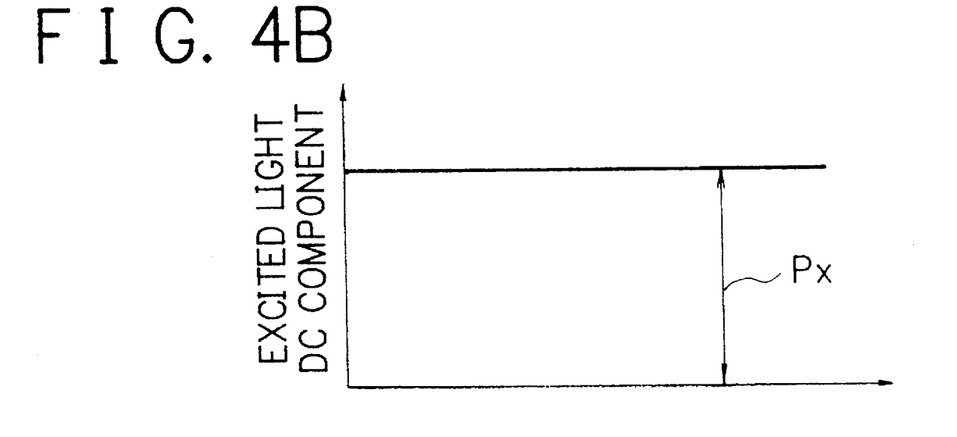
Figure 4C:
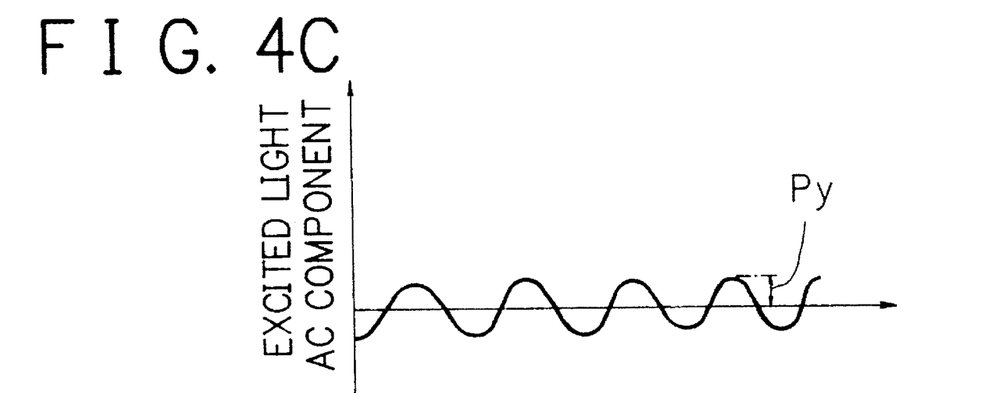
Figure 5:
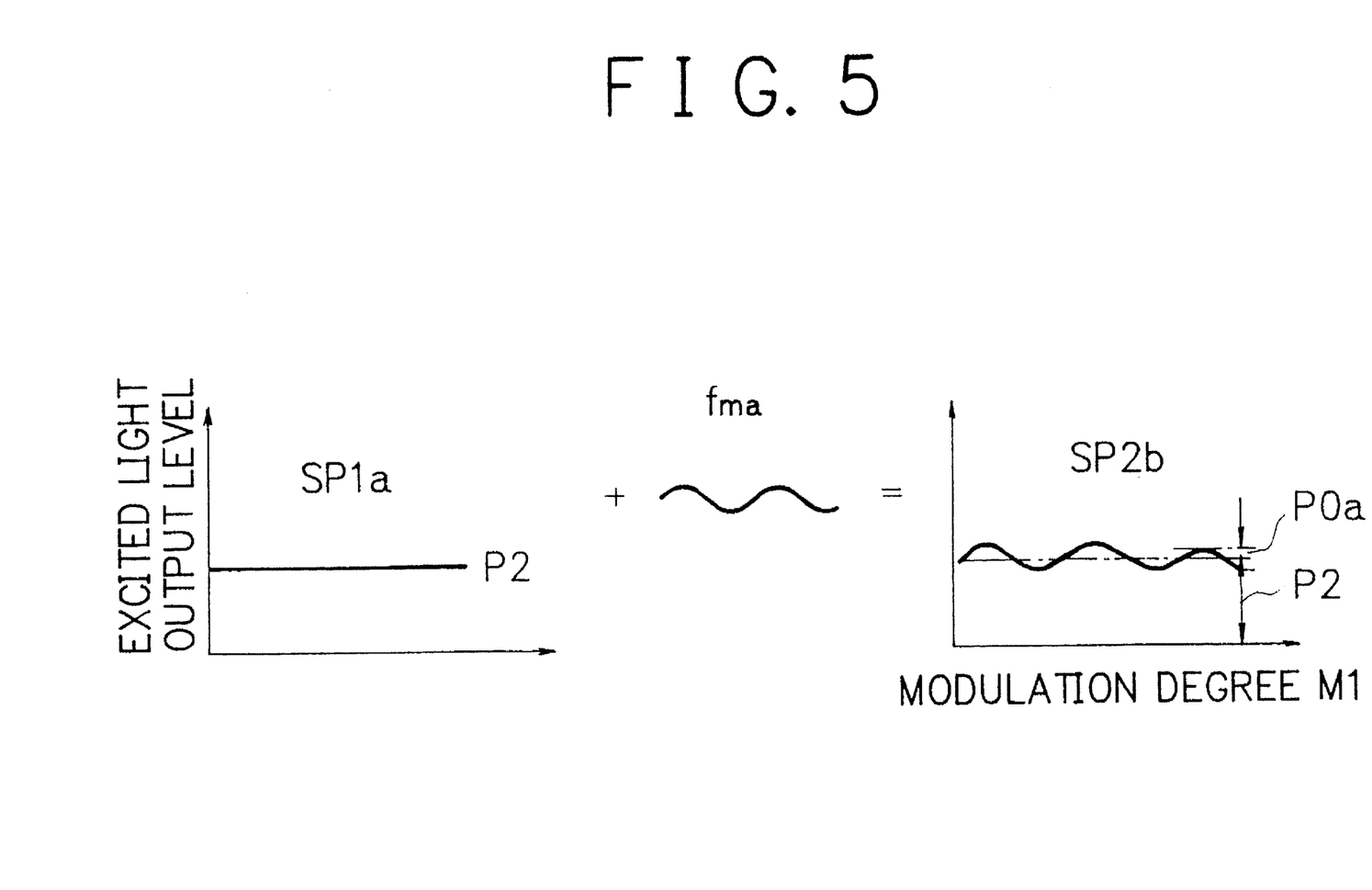
FIG. 5 is a graph showing signal waveforms useful to explain a relationship between the amplitude of the modulation signal and the modulation degree in the apparatus in accordance with the present invention.

Referring now to the accompanying drawings, description will be given of an embodiment of the optical modulating and amplifying apparatus in accordance with the present invention. FIGS. 3 to 5 show representative aspects of the embodiment of the apparatus capable of conducting the modulation with a high signal-to-noise ratio. FIG. 3 shows in a block diagram the circuit constitution of the apparatus, whereas FIGS. 4A to 4C and FIG. 5 are explanatory diagrams of the control operation of the embodiment.

In FIG. 3, the apparatus of the embodiment includes an optical amplifier 3 and a modulator 4. The amplifier 3 includes an optical mixer 31 for combining an input optical signal S1 to undergo modulation with an excited light modulated and an optical fiber 32 using erbium. The amplifier 3 produces an output light signal S2. The modulator 4 includes a laser diode (to be abbreviated as LD herebelow) 40 as laser emitting means for illuminating an excited light SP, a photodiode 41 as laser light sensing means for converting part of the excited light SP from the diode 40 into an electric signal, a laser diode driver circuit 42 as laser light driving means to feed a dc level bias signal, which may vary with time or by the installation site of the apparatus, to the laser diode 40, a variable gain amplifier 43 as modulation signal control means for delivering a modulation signal to the driver 42, and an oscillator 44 as oscillation means to produce a source signal of the modulation signal. There is further included a control signal generator 45 as control signal generating means for supplying a control signal to the amplifier 43.

The generator 45 includes a mean value sensor 51 as mean value sensing means to receive a sense signal from the photodiode 41 so as to sense a mean value of the excited light SP from the laser diode 40, a modulation signal sensor 52 as modulating signal sensing means for receiving a sense signal from the photodiode 41 and sensing an amplitude of the modulation signal component of the emission signal from the laser diode 40, an analog-to-digital (A/D) converter 53 for converting each of the analog sense signals respectively from the sensor circuits 51 and 52, and a divider circuit 54 as operating means for effect a division between the digital signals from the A/D converter 53.

In the modulator 4 constructed as above, according to the excited light SP from the laser diode 40, there is formed a loop circuit including the photodiode 41, the control signal generator 45, the variable gain amplifier 43, and the laser diode driver 42. In the loop circuit, according to the oscillation signal from the oscillator 44, the gain of the amplifier 43 is controlled by the generator 45, thereby regulating the stable emission of the laser diode 40.

The means value sensor 51 constituting the control signal generator 45 is implemented, for example, as a smoothing circuit including an integrating circuit. Moreover, the modulation signal sensor 52 is configured, for example, with a dc breaking capacitor, not shown.

FIG. 4A shows in a graph a signal characteristic of the excited light SP sensed by the photodiode 41, whereas FIGS. 4B and 4C respectively show a direct-current (dc) component and an alternating-current (ac) component of the signal. The mean value sensor 51 senses a dc level Px of the excited light according to the sense signal from the photodiode 41 as shown in FIG. 4B. The modulation signal sensor 52 extracts an ac component of the signal as shown in FIG. 4C so as to obtain an amplitude Py of the modulation signal according to half the difference between peak and bottom values of the extracted ac component.

In addition, the divider circuit 54 conducts an operation Py/Px to attain the modulation degree according to the dc level Px from the sensor 51 and the ac level Py representing the amplitude of the ac component from the sensor 52. Furthermore, in a control signal generation section 54a of the circuit 54, the result Py/Px is compared with a reference value, i.e. a preset modulation degree having a predetermined level corresponding to the dc level Px. Thus, based on a result of the comparison and the dc level Px from the sensor 51, there is computed a modulation degree difference or selected the reference value to thereby generate a control signal. The control signal is then fed to the variable gain amplifier 43.

The amplifier 43 is responsive to the control signal from the signal generating section of the circuit 5A to control the amplification degree so as to set the amplifier 43 of the oscillation signal from the oscillator 44 to a favorable amplitude value associated with the detected light, thereby delivering the amplified modulation signal to the laser diode driver 42. The driver 42 receives the modulation signal from the amplifier 43 and then adds a current bias signal thereto to produce a resultant signal. In response to the signal from the driver 42, the laser diode 40 is driven to emit a laser light therefrom.

The excited light SP produced from the laser diode 40 is fed to the optical mixer 31 of the amplifier 3. In response to the light SP, the amplifier 3 alters the gain thereof to modulate the input optical signal S1. In the amplifier 3, the signal S1 is amplified according to intensity of the light SP from the diode 40 so as to resultantly create an output optical signal S2.

Description will now be given of the amplification of the amplifier 3, particularly, a relationship between the modulation degree and the amplitude of the output signal S2. As can be seen from FIG. 2A, the degree of modulation m1 (m1= P0/P1) in which the modulation signal fm having the amplitude P0 is superimposed onto the output level P1 of the excited light SP is assumed to be the predetermined modulation degree above. Under this condition, assume the dc level of the excited light SP1 is decreased from P1 to P2 as shown in FIGS. 2A and 2B. The value of the dc level of the excited light SP1a is sensed by the mean value sensor 51, whereas the value of the amplitude of the modulation signal fm is measured by the modulation signal sensor 52. The obtained values are respectively converted through the A/D converter 52 into digital values to be transmitted to the divider 54.

On receiving the dc level value and the amplitude value, the dividing circuit 54 computes a modulation degree m2 in a realtime fashion as shown in FIG. 2B. Comparing the attained modulation degree m2 with the preset modulation degree m1, there is obtained an amplitude value currently suitable for the dc level P2 of the excited light SP1a so as to produce a control signal associated with the computation result. Based on the resultant control signal, the gain of the variable gain amplifier 43 is controlled for the oscillation signal from the oscillator 44. The oscillation signal is thus regulated through the gain control of the amplifier 43 to be a signal $fm_a$ having an appropriate amplitude P0a as shown in FIG. 5, thereby feeding a modulation signal SP2b to the laser diode driver 42. In the driver 42, the bias P2 is applied to the oscillation signal to thereby drive the laser diode 40. In response thereto, the laser diode 40 creates an excited light SP having the modulation degree m1. The control signal generator 45 sequentially achieves the control operation of the excited light SP.

In consequence, even when the dc output level of the excited light is altered, the degree of modulation can be kept unchanged. This suppresses the deterioration of the signal-to-noise ratio of the transmission signal and facilitates detection of the superimposed signal.

In this connection, the embodiment has been described only as an example of a suitable implementation of the present invention. The present invention is not restricted by the embodiment and can be changed or modified without departing from the scope and spirit of the invention. For example, the control signal generating circuit 45 is not limited to the configuration employed in the means value sensor 51, the modulation signal sensor 52, the A/D converter 53, and the dividing circuit 54 but can be configured in various circuit structures. Moreover, the variable gain amplifier 48 may be constructed with an attenuator.

As above, in the optical modulating and amplifying apparatus in accordance with the present invention, the control signal generating means, the modulation signal control means, the laser light driving means, and the laser light emitting means constitute a loop circuit achieving a control operation to set the degree of modulation of the excited light to a predetermined value. In consequence, since the modulation degree of the excited signal is kept unchanged through the control operation, there is attained a satisfactory signal-to-noise ratio for the modified signal to be transmitted: moreover, the modulation and amplification of the input optical signal are efficiently conducted.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An optical modulating and amplifying apparatus in which an input signal is optically amplified according to an excited light, which is produced according to an oscillation signal, said optical modulating and amplifying apparatus, comprising:

an amplifier device comprising an optical mixer for mixing said input signal and said excited light, and an amplifier for amplifying an output from said optical mixer;

an oscillation means for producing an oscillation signal;

laser light driving means for generating a drive signal based on the oscillation signal;

laser light emitting means for producing said excited light based on the drive signal;

control signal generating means for sensing the excited light and for producing a control signal setting a modulation degree of the excited light to a predetermined modulation degree; and modulation signal control means having inputs for respectively receiving he control signal and the oscillation signal and for producing a modulation signal, the laser light driving means driving the laser light emitting means according to the modulation signal;

wherein said amplifier device receives said excited light and amplifies said input signal based upon said excited light.

2. An apparatus as claimed in claim 1, wherein the laser light driving means drives the laser light emitting means according to a signal obtained by adding a dc-level bias to the modulation signal.

3. An apparatus as claimed is claim 1, wherein the control signal generating means includes mean value sensing means, a modulation signal sensing means, and an operating means, the mean value sensing means sensing a dc level of the excited light, the modulation signal sensing means sensing an amplitude of a modulation signal superimposed onto the excited light, the operating means computing the modulation degree according to the dc level and the amplitude of the modulation signal.

4. An apparatus as claimed in claim 1, wherein the modulation signal control means increases or decreases the amplitude of the oscillation signal according to the control signal produced from the control signal generating means.

5. An apparatus as claimed in claim 1, wherein the optical modulating and amplifying apparatus further includes laser light sensing means, the laser light sensing means sensing the excited light emitted from the laser light emitting means.

6. An optical modulating and amplifying apparatus for modulating and amplifying an optical signal being transmitted through an optical fiber line by mixing a beam of modulated light with said optical signal, said beam of modulated light comprising an optical bias component and an optical modulation component, said optical modulating and amplifying apparatus comprising:

an optical mixer for mixing said optical signl and said beam of modulated light;

an amplifier for amplifying an output of said optical mixer; and an optical modulator, connected to said optical mixer, for generating and supplying said beam of modulated light to said optical mixer;

said optical modulator comprising:

a first signal source for generating an alternating-current signal, said first signal source comprising an amplifier for amplifying said alternating-current signal by a variable gain to output a modulation signal;

a second signal source for generating a direct-current signal, said second signal source being connected to said first signal source for adding said modulation signal to said direct-current signal to produce a modulated signal comprising a bias component and a modulation component;

a laser diode for converting said modulated signal into said beam of modulated light, wherein said optical bias component of said beam of modulated light has an intensity corresponding to a level of said bias component of said modulated signal, and wherein said optical modulation component of said beam of modulated light has an amplitude corresponding to an amplitude of said modulation component of said modulated signal; and control means, coupled to said laser diode, for generating a control signal for controlling the gain of said amplifier of said first signal source;

wherein said control means comprises:

a detection means for detecting the intensity of said optical bias component and the amplitude of said optical modulation component;

an arithmetic device for dividing a value representing the intensity of said optical bias by a value representing the amplitude of said optical modulation component to determine a modulation degree of said beam of modulated light; and a signal generator for generating said control signal in response to said modulation degree.

7. The optical modulating and amplifying apparatus according to claim 6, wherein said signal generator compares said modulation degree with a predetermined reference value to output a difference therebetween as said control signal.

* * * * *

UNITED STATES PATENT AND TRADEMARK OFFICE
CERTIFICATE OF CORRECTION

PATENT NO.   : 5,479,424
DATED        : December 26, 1995
INVENTOR(S)  : Hiroshi SAKUYAMA It is certified that error(s) appears in the above-identified patent and that said Letters Patent is hereby corrected as shown below:

Col. 4, line 34, delete "5A", insert --54--.

Col. 6, line 56, delete "signl", insert --signal--.

Signed and Sealed this

Eighteenth Day of June, 1996

BRUCE LEHMAN

*Attest:*

*Attesting Officer*         Commissioner of Patents and Trademarks